United States Patent
Fujikawa et al.

(10) Patent No.: US 7,798,823 B2
(45) Date of Patent: Sep. 21, 2010

(54) ELECTRONIC DEVICE AND PRINTED CIRCUIT BOARD UNIT

(75) Inventors: Hideyuki Fujikawa, Kawasaki (JP); Hiromitsu Hagimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/230,325

(22) Filed: Aug. 27, 2008

(65) Prior Publication Data
US 2009/0142955 A1 Jun. 4, 2009

(30) Foreign Application Priority Data
Nov. 29, 2007 (JP) ............................. 2007-308874

(51) Int. Cl.
*H01R 12/00* (2006.01)
(52) U.S. Cl. ........................................................ 439/82
(58) Field of Classification Search ............ 439/82–83, 439/497, 579, 680
See application file for complete search history.

(56) References Cited

U.S. PATENT DOCUMENTS

| | | | |
|---|---|---|---|
| 7,020,443 B2 * | 3/2006 | Talvitie et al. ............ | 455/67.14 |
| 7,242,299 B2 * | 7/2007 | Kelsch et al. ............. | 340/568.1 |
| 7,416,435 B2 | 8/2008 | Onogi | |
| 2004/0150523 A1 * | 8/2004 | Kelsch et al. ............. | 340/568.1 |
| 2005/0237724 A1 * | 10/2005 | Fiorentino et al. ........... | 361/752 |
| 2006/0252310 A1 * | 11/2006 | Yamada et al. .............. | 439/579 |
| 2006/0281353 A1 * | 12/2006 | Suzuki et al. ............... | 439/260 |
| 2007/0232128 A1 | 10/2007 | Onogi | |
| 2008/0081517 A1 * | 4/2008 | Jaklin et al. .................. | 439/638 |

FOREIGN PATENT DOCUMENTS

| | | |
|---|---|---|
| CN | 1291813 | 4/2001 |
| CN | 101046218 | 10/2007 |
| JP | 5-46072 | 6/1993 |
| JP | 11-067334 | 3/1999 |
| JP | 11-135188 | 5/1999 |
| JP | 2002-217565 | 8/2002 |
| JP | 2005-56952 | 3/2005 |

OTHER PUBLICATIONS

Korean Office Action mailed Feb. 17, 2010 in corresponding Korean Patent Application 10-2008-0091927.
Office Action mailed May 24, 2010 and issued in corresponding Chinese Patent Application No. 200810149192.7.

* cited by examiner

*Primary Examiner*—Jean F Duverne
(74) *Attorney, Agent, or Firm*—Staas & Halsey LLP (57) ABSTRACT

The invention provides a printed circuit board including a first surface, a second surface which is a rear surface to the first surface, a connector installed on the first surface, and, formed between the first surface and the second surface, one of a through hole piercing the printed circuit board and a recess formed in an edge section of the printed circuit board; a cable including a first terminal that is removably fitted to the connector and a connecting wire portion located between the first terminal and a second terminal, the connecting wire portion extending from the first surface to the second surface of the printed circuit board through the one of the through hole and the recess when the first terminal is in a state of being fitted to the connector; and a casing for containing the printed circuit board and the cable.

10 Claims, 12 Drawing Sheets

ELECTRONIC DEVICE AND PRINTED CIRCUIT BOARD UNIT

BACKGROUND OF THE INVENTION

1. Field of the Invention

The present invention relates to an electronic device and a printed circuit board unit including a printed circuit board and a cable to be attached to a connector of the printed circuit board.

2. Description of the Related Art

In the field of personal computer, it is required to fulfill both requirements of miniaturization and weigh reduction of a device and upsizing of a display screen. To fulfill these requirements, a variety of techniques have been used as a display device using a thin and light liquid crystal panel is applied, a light source, a control board and the like are arranged behind a liquid crystal panel rather than in a side thereof, so that a display screen is widened according to a narrowed gap between a casing and the liquid crystal panel. Further, an integrated-type desktop personal computer in which a CPU, a hard disk and a display device are housed within a same casing has appeared. Thus, miniaturization and weight reduction has been advanced not only in a laptop personal computer to be carried around, but also in a stationary personal computer.

However, when attempting to fulfill both requirements of miniaturization and weigh reduction of a device and upsizing of a display screen, a liquid crystal panel, a hard disk, a cooling fan, a power source device, various circuit boards and the like tend to be tightly packed in the casing with little space between them. As a result, cables for connecting them are complicatedly wired. In recent years, to simplify wiring and downsize and to reduce the weight of cables, a flat cable having multiple parallel wires disposed widthwise and a flexible printed circuit board in which conducting foil is printed on an insulating film have been applied. However, a flat cable and a flexible printed circuit board may be pulled out from their connectors or damaged when pulled or twisted at terminals. As described above, a liquid crystal panel, a hard disk and the like are tightly packed inside a personal computer. Therefore, when an external force is unwittingly applied to a cable during maintenance or the like and the cable is pulled out or damaged, it may be difficult to find a location of the failure. Moreover, the operation to reinstall the cable may be troublesome.

Regarding this point, it is proposed that a cable is fired to a casing using a jumper wires (Japanese Utility Model Application Publication No. H5-46072) or a socket or a connector is provided with a hook or the like to fix a cable (Japanese Patent Application Publication No. H11-67334 and Japanese Patent Application Publication No. H11-135188). By fixing the cable attached to the connector onto the casing or to the connector, it is possible to prevent a failure that the cable is pulled out of the connector when an external force is applied.

However, the method recorded in Japanese Utility Model Application Publication No. H5-46072 has a problem in that new jumper wires have to be fitted when the cable is reattached to the connector, and so the cost of reattachment is high. A further problem is that sufficient space and a mechanism for fitting the jumper have to be provided inside the device, so that the device will increase in size. The methods recorded in Japanese Patent Application Publication No. H11-67334 and Japanese Patent Application Publication No. H11-135188 also result in an increase in cost because a special connector having a hook is used so that a general-purpose connector may not be diverted.

The above-described problems are not limited to a personal computer, but the same generally goes to an electronic device which include a circuit board, a cable and the like.

SUMMARY OF THE INVENTION

The present invention has been made in view of the above circumstances and provides an electronic device and a printed circuit board unit which prevent a cable from being pulled out while suppressing an increase in cost.

A basic aspect of the printed circuit board unit of the invention includes:

a printed circuit board including a first surface, a second surface which is a rear surface to the first surface, a connector mounted on the first surface, and, one of a through hole and a recess, the through hole being formed between the first surface and the second surface, and penetrating the printed circuit board, the recess being formed in an edge section of the printed circuit board;

a cable including a first terminal that is removably fitted to the connector and a connecting wire portion located between the first terminal and a second terminal, the connecting wire portion being passed through either one of the through hole and the recess and extending from the first surface to the second surface of the printed circuit board in a state in which the first terminal is fitted to the connector.

A basic aspect of the electronic device of the invention includes the basic aspect of the printed circuit board unit and a casing which houses the printed circuit board and the cable.

In these basic aspects, when a cable extending through to the second surface, rear surface with respect to the first surface where the connector is provided in the printed circuit board is pulled, a force in the direction from the first surface to the second surface is applied to the first terminal of the cable, so that the first terminal is pressed against the connector. In addition, when the cable is moved in a cress direction, movement of the cable is restrained by the through hole or recess provided in the printed circuit board, and twisting of the cable is prevented. Hence, there is no need to prepare a jumper lead a particular connector having, a hook or the like, and it is therefore possible to prevent the cable from being pulled out while suppressing cost increases.

The basic aspects may be preferably combined with an applied aspect in which the casing includes in the inside thereof a frame having a first surface, a second surface which is a rear surface to the first surface, and one of a through hole and a recess, the through hole being formed between the first surface and the second surface and penetrating the frame, the recess being formed in an edge section of the frame, and the connecting wire portion of the cable is passed through one of the through hole and the recess of the printed circuit board and being passed through one of the through hole and the recess of the frame.

A frame is generally provided in a casing for fixing and protecting the printed circuit board and the like. The through hole or recess is formed in the frame as well as in the printed circuit board, and thus it is possible to cause the cable to pass through the hole or recess without pulling the cable around aside of the frame. Accordingly, it becomes easier to route the cable, and it is possible to more reliably prevent the cable from being pulled out.

The basic aspects may be preferably combined with an applied aspect in which the cable is a flat cable in which a plurality of conductors are disposed in a direction perpendicular to a longitudinal direction of the conductors such that the connecting wire portion having a predetermined width is formed, and the one of the through hole and the recess of the printed circuit board is one of a long hole and a recess which have a straight line portion which is at least as long as the width of the connecting wire portion of the flat cable.

According to the preferable applied aspect, the flat cable can be held in the through hole or recess of the printed circuit board without folding or bending, and it is possible to alleviate the problems that the flat cable is pulled out or damaged.

The applied aspect in which the cable is a flat cable may be preferably combined with an applied aspect in which the connector includes terminals which are disposed in a longitudinal direction of the connector and electrically connect to conductors when the flat cable is installed, and the straight line portion of the one of the through hole and the recess is parallel to the longitudinal direction of the connector, and is at least equal in length to a width, viewed in a direction perpendicular to the longitudinal direction, of terminals of the connector.

Providing a slit (a long opening) or recess that is parallel to the longitudinal direction of the connector and has a portion which is at least as long as the connector allows the slit or recess to hold the flat cable fitted to the connector without the flat cable being twisted. Damage to the flat cable can therefore be reliably suppressed.

The basic aspects may be preferably combined with applied aspect in which the casing includes a front casing and a rear casing which is assembled with the front casing, and the casing houses the printed circuit board such that the first surface of the printed circuit board is on a side of the front casing, and houses other components to be mounted between the second surface of the printed circuit board and the rear casing in a state in which the printed circuit board is hidden.

In this applied aspect, the printed circuit board is hidden other components, making it difficult to refit the cable after disconnection from the connector. However, a cable pull-out can be prevented, even when an external force is applied during maintenance or the like, by passing the cable through the through hole or recess.

The applied aspects in which the flat cable is a flexible flat cable in which the conductor is a flat plate conductor or the flat cable is a flexible printed circuit board.

In recent years, flexible flat cables and flexible printed circuit boards have been widely used as small and light cables. However, there is a problem in that such flat cables are easily separated from a connector by twisting. According to the basic aspects, however, movement of the cable is specifically restrained by the through hole or recess in the printed circuit board. Hence, it is possible to reliably prevent cable pull-out and damage also with respect to a flexible flat cable or flexible printed circuit board is used.

As described above, according to the basic aspects of the electronic device and the printed circuit board unit, it is possible to reliably prevent cable pull-out and damage while suppressing cost increases.

DETAILED DESCRIPTION OF THE INVENTION

Embodiments of the electronic device and printed circuit board unit will be described in detail with reference to the drawings.

Figure 1:
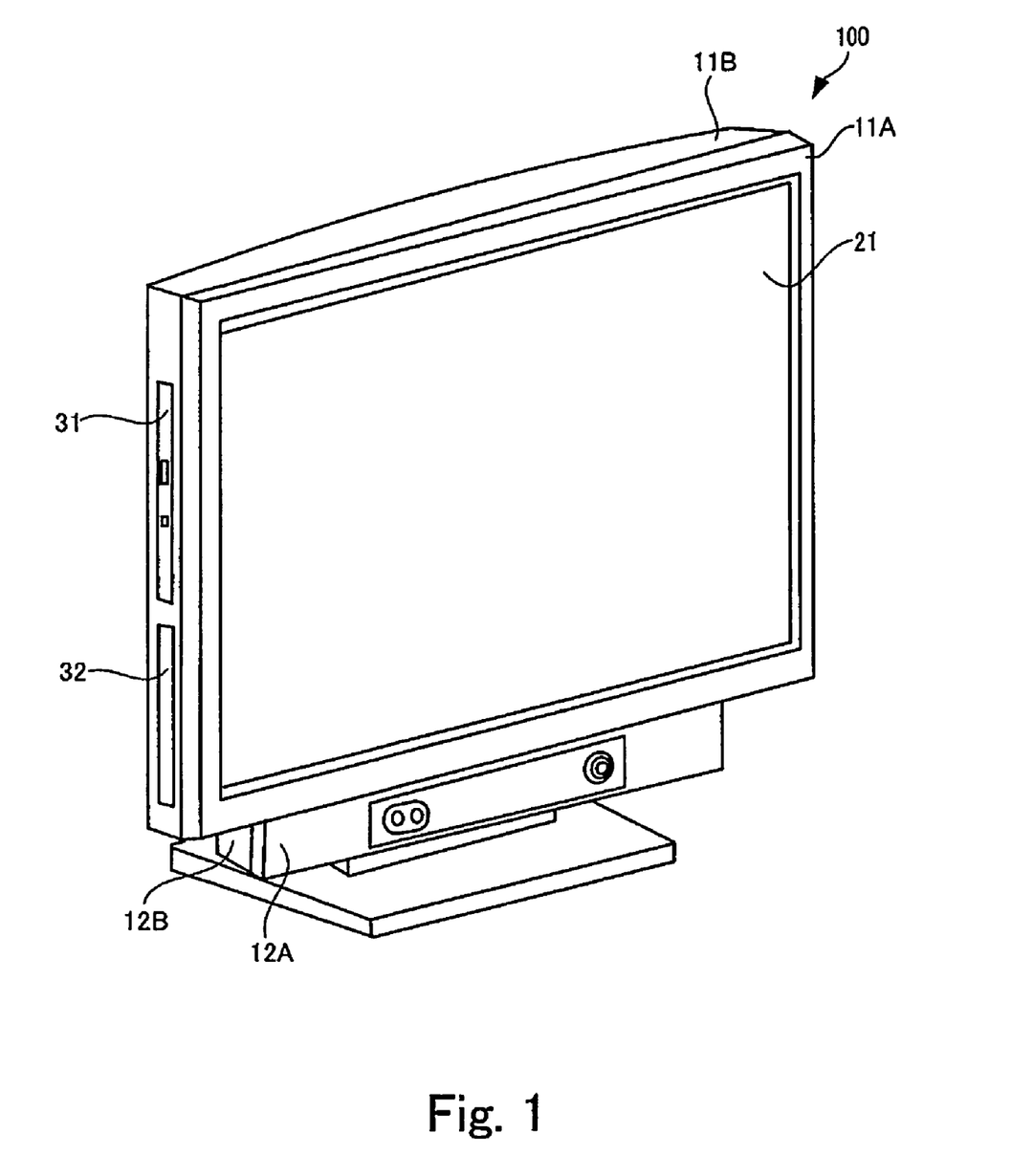
FIG. 1 is an external view of a personal computer which is a first embodiment of an electronic device.

FIG. 1 is an exterior view of a personal computer 100 of a first embodiment of an electronic device.

The personal computer 100 is an integrated-type personal computer in which a display device for displaying information, a hard disk drive, and the CPU are all built into a same casing. Note that although the personal computer 100 is, in reality, connected to a mouse and a keyboard, these are omitted in FIG. 1.

FIG. 1 shows the personal computer 100 as viewed from the front. In a space defined by a upper front casing 11A, an upper rear casing 11B, a lower front casing 12A, and a lower rear casing 12B, the personal computer 100 contains a liquid crystal panel with a display screen 21 spreading on a surface thereof, a CPU, a hard disk drive, a cooling fan, a power supply device, various circuit boards, cables for connecting them to each other, and other parts. A combination of the upper front casing 11A, the upper rear casing 11B, the lower front casing 12A and the lower rear casing 12B corresponds to an example of the casing in the basic aspects.

The personal computer 100 has, on a side surface, an optical disk loading slot 31 for loading an optical disk such as a CD and a DVD and a flexible disk (hereinafter abbreviate to FD) loading slot 32 for loading a FD.

Figure 2:
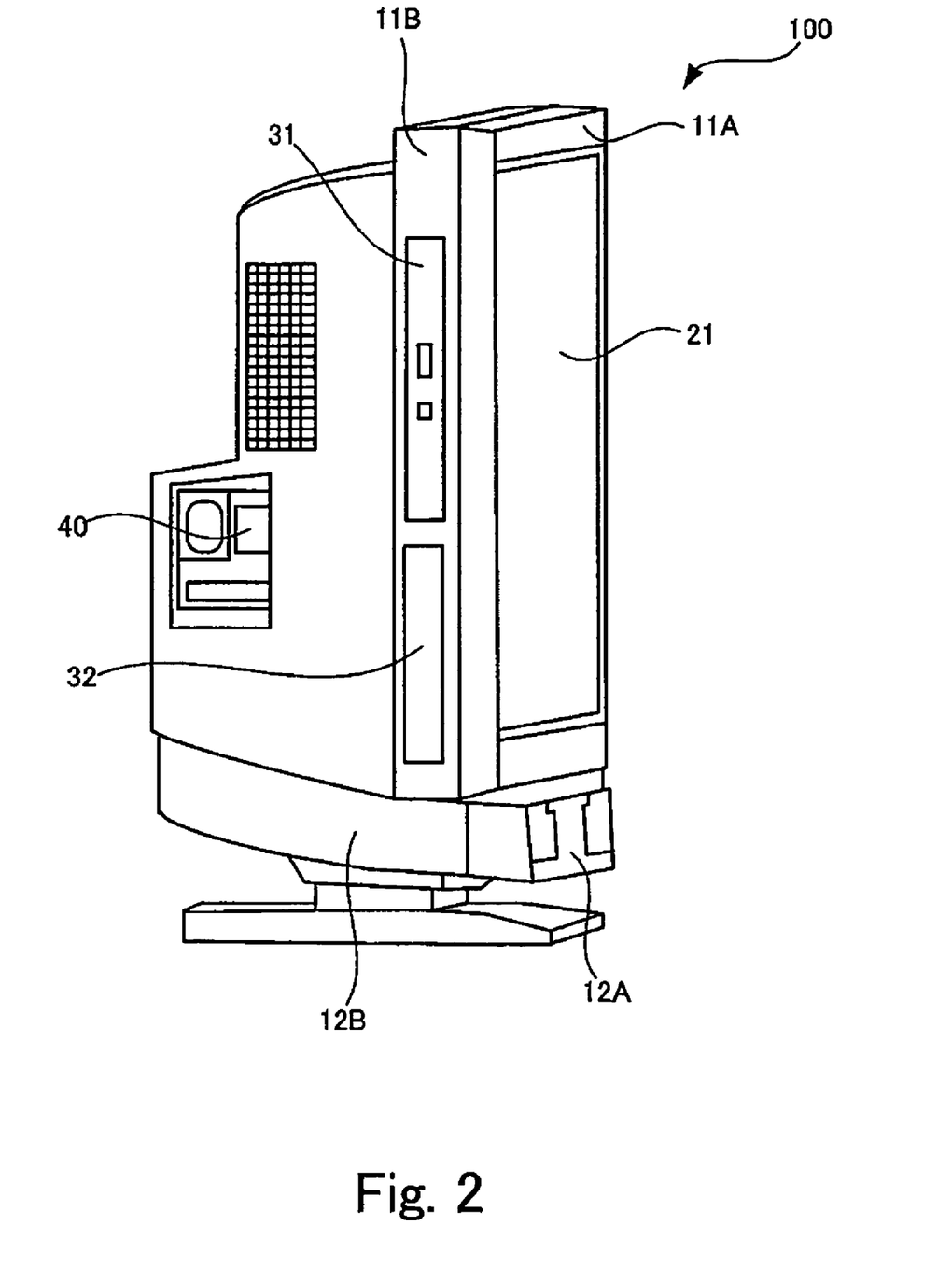
FIG. 2 is a side view of the personal computer.
Figure 3:
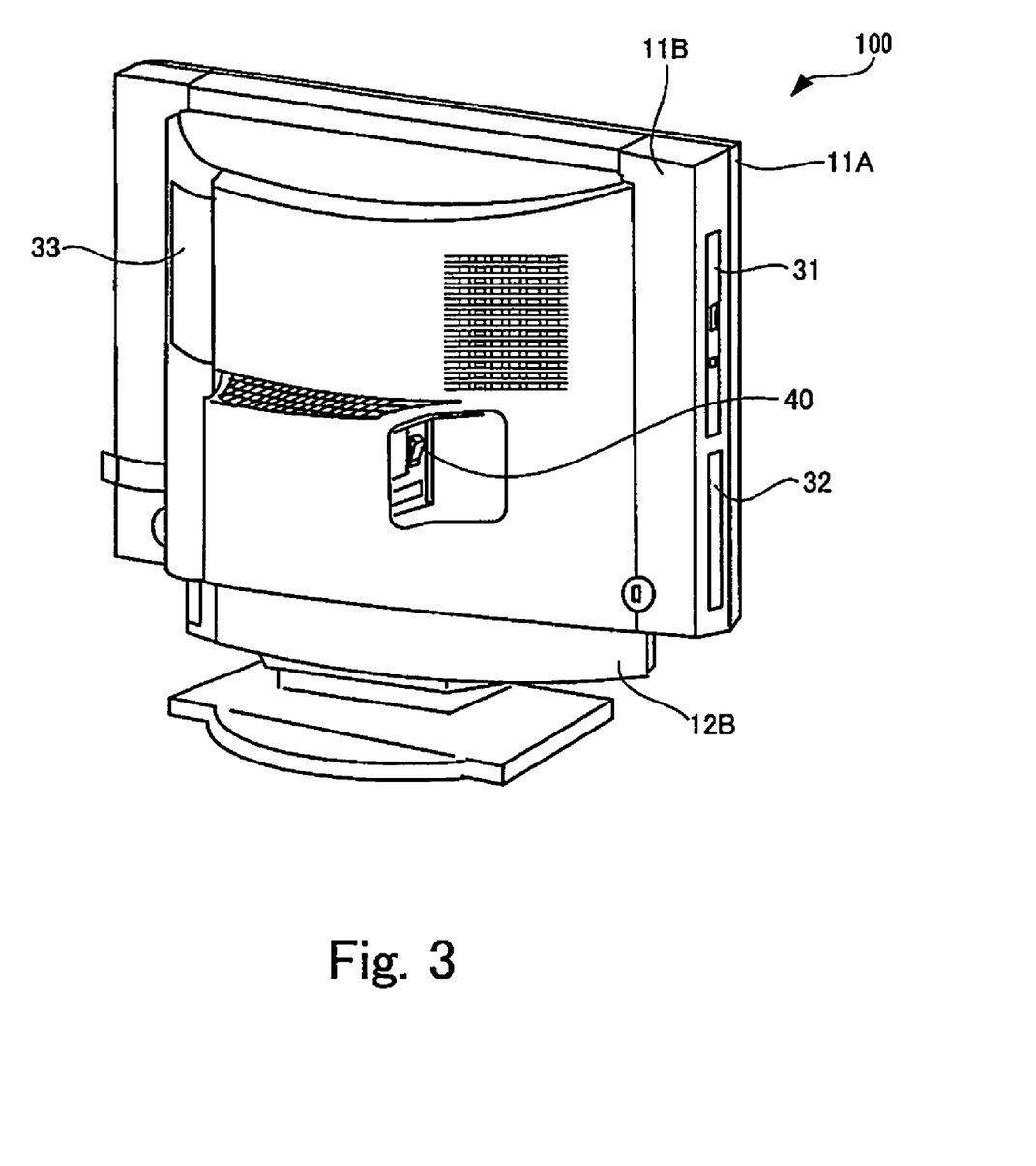
FIG. 3 is a rear view of the personal computer.

FIG. 2 is a side view of the personal computer 100 and FIG. 3 is a rear view of the personal computer 100.

In the personal computer 100, the upper front casing 11B is attached to the upper rear casing 11A, and the lower front casing 12B is attached to the lower rear casing 12A. A combination of the upper front casing 11A and the lower front casing 12A is an example of the front surface casing of the applied aspects described above. A combination of the upper rear casing 11B and the lower rear casing 12B is an example of the rear casing of the applied aspects described above.

A liquid crystal panel is fitted in the upper front casing 11A with the display screen 21 facing the front. A hard disk drive and various circuit boards are contained on a rear surface side of the display screen 21. A power switch 40 for switching the power on and off and an expansion card slot 33 for loading an expansion card for expanding functions such as a LAN card and the like are provided in the rear surface of the personal computer 100.

Figure 4:
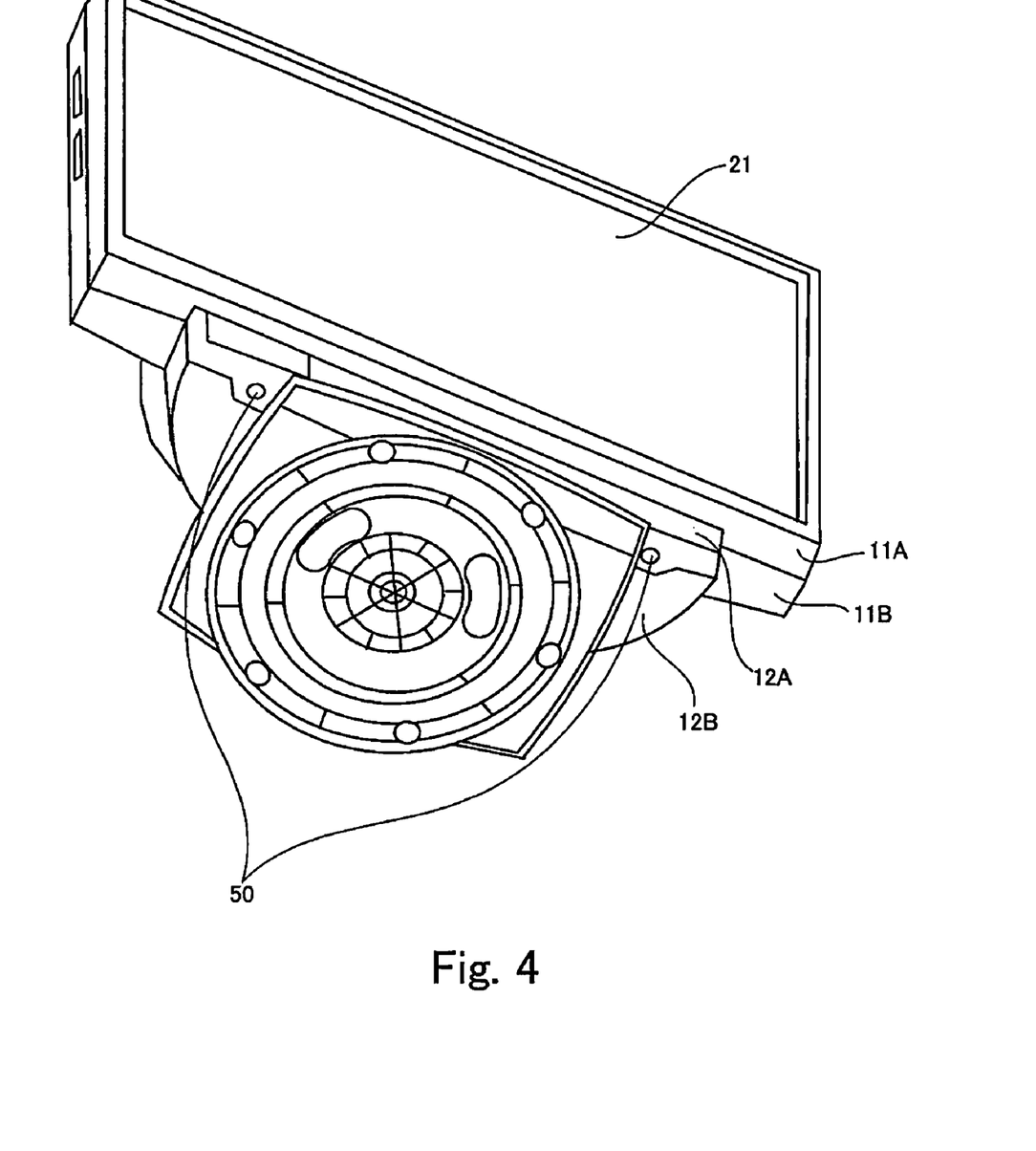
FIG. 4 is a bottom view of the personal computer.

FIG. 4 is a bottom view of the personal computer 100.

An upper section in the personal computer 100 contains an replaceable hard disk drive, and a lower section in the personal computer 100 contains elements such as circuit boards which are not usually replaced. The elements such as circuit boards are protected by a frame or the like. For instance, the lower front casing 12A may be an exchangeable plastic cover. The printed circuit boards may be attached to the metal plate frame (see FIG. 8), and the plate metal frame may be fixed to the lower front casing 12A using screws 50. In normal maintenance, the upper front casing 11A and the upper rear casing 11B alone are removed and operations such as exchanging the hard disk drive contained in the upper section in the personal computer 100 are performed.

Figure 5:
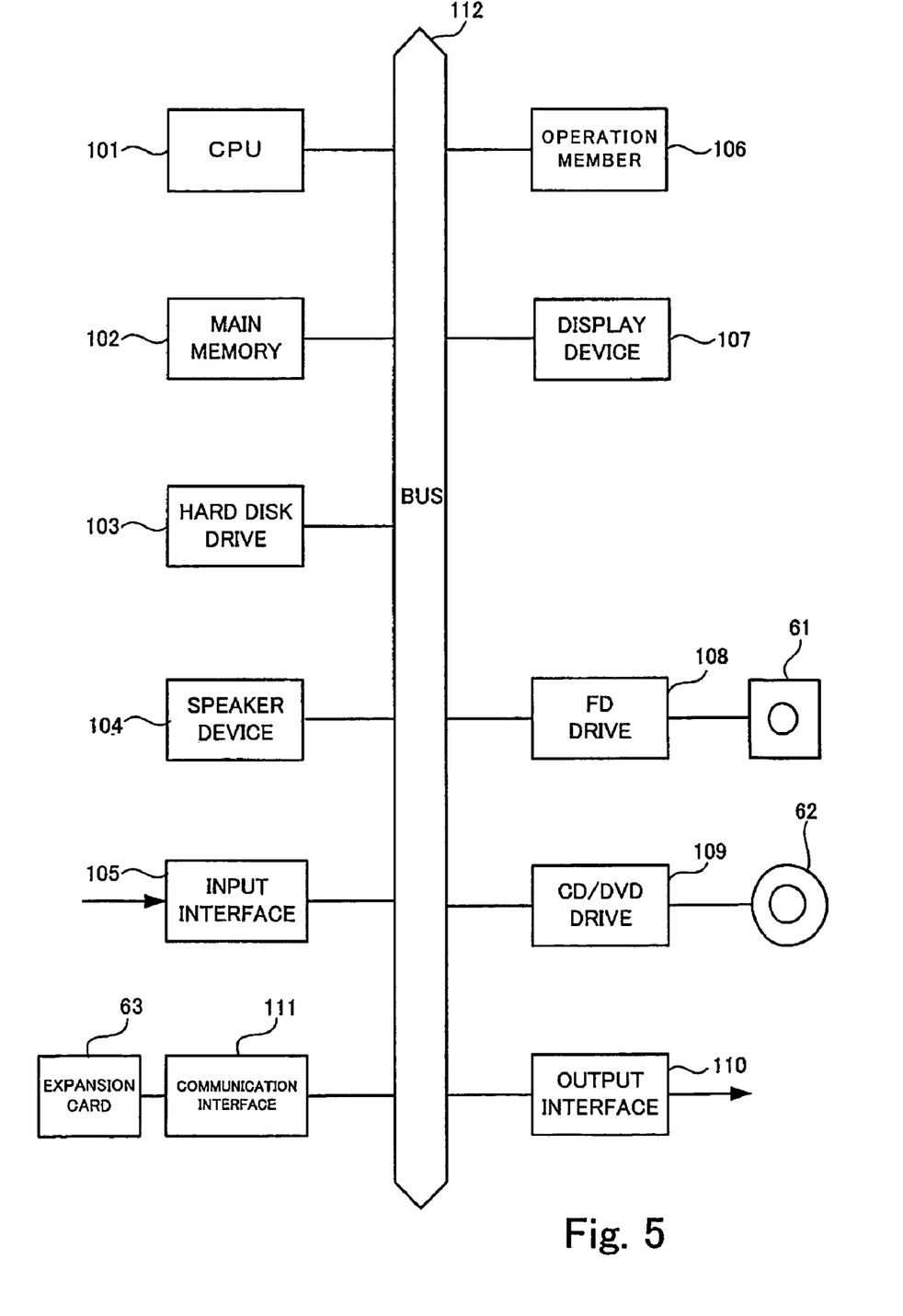
FIG. 5 is a schematic view of an internal construction of the personal computer.

FIG. 5 is a schematic view of the internal construction of the personal computer 100.

As shown in FIG. 5, the personal computer 100 includes a CPU 101 for executing various types of program, a main memory 101 deployed to allow the reading and execution by the CPU 101 of programs stored on the hard disk drive 103, a hard disk drive 103 for storing various programs and data, a speaker device 104 for generating an audio signal and outputting sound, an input interface 105 to receive input of data from external devices, operations elements 106 such as a keyboard and a tracker pad, a display device 107 for displaying information on the display screen 21, an FD drive for accessing an FD 61 which has been loaded therein, a CD/DVD drive 109 for accessing a CD-ROM 62 or DVD which has been loaded therein, an output interface 110 for outputting data to external devices, and a communication interface 111 for performing communications using an expansion card 63. The various elements are interconnected via a bus 112.

Here, in the personal computer 100, the hard disk drive 103, the CPU 101 and the like are tightly packed behind the liquid crystal panel. Further, the control circuit board and the like which are rarely replaced in usual maintenance are disposed behind the lower front casing 12A and hidden by a frame or the like. Thus, since it is not possible to check all the elements housed in the casing even if the upper rear casing 11B is removed from the upper front casing 11A, the personal computer 100 of the present embodiment is provided with measures to prevent a failure that the cable is pulled out by an external force applied during maintenance or the like.

Figure 6:
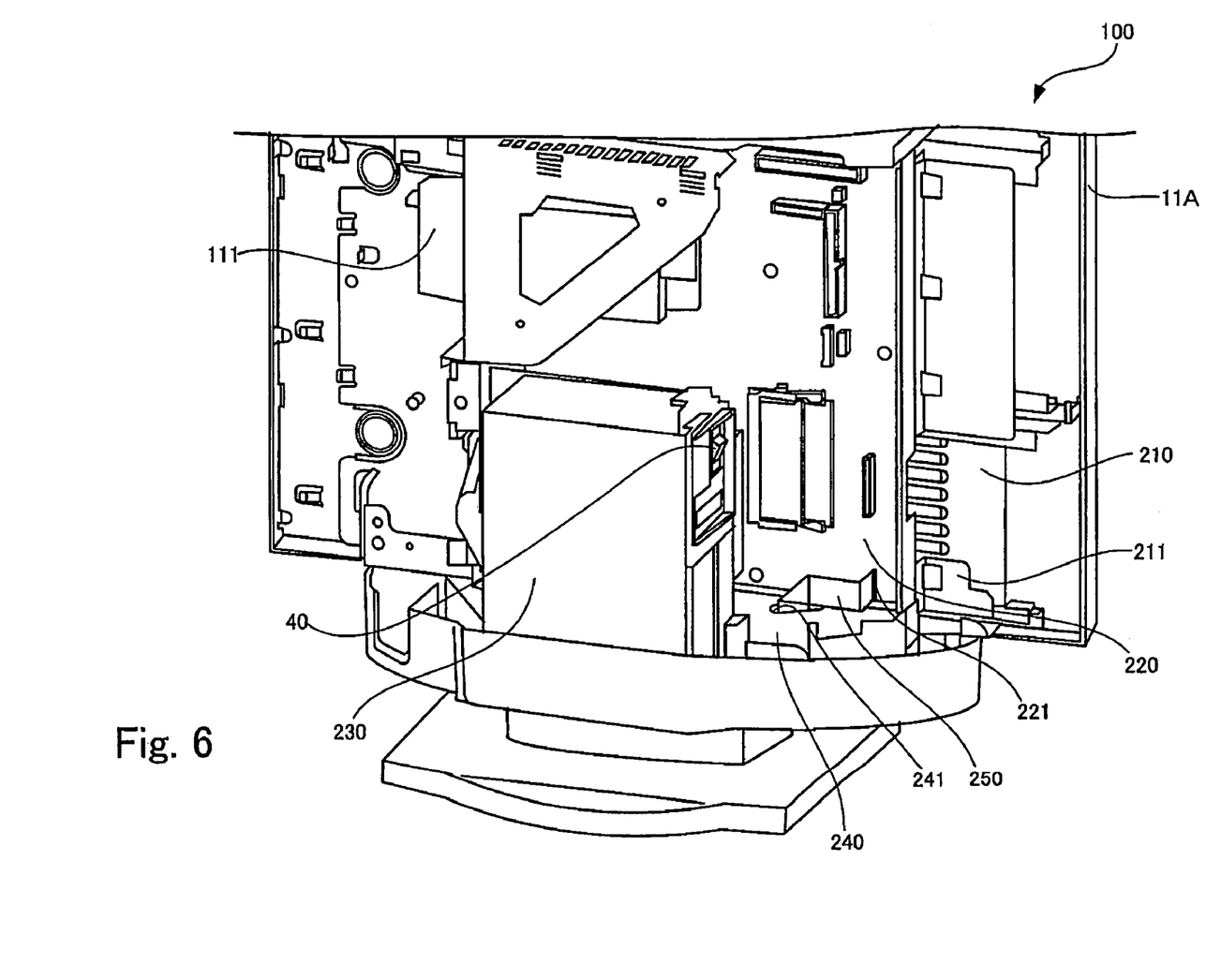
FIG. 6 is a rear view of the personal computer with an upper rear casing removed.

FIG. 6 is a rear view of the personal computer 100 after the upper rear casing 11B has been removed.

As shown in FIG. 6, a liquid crystal panel 210 is fitted into the upper front casing 11A with the display screen 21 shown in FIG. 1 facing the front. On a rear surface side of the liquid crystal panel 210, a control circuit board 211 for controlling the liquid crystal panel 210, a communication interface 111 also shown in FIG. 5, the hard disk drive 103 and the like are mounted thereon. A main circuit board 220 or which a power supply device 230 for controlling electric power and the like are tightly arranged. The upper front casing 11A and the upper rear casing 11B, and the lower front casing 12A and the lower rear casing 12B are separated by a frame 240. Under of the frame 240 is housed a printed circuit board 260 (see FIGS. 7 and 8) on which the speaker device 104 shown in FIG. 5, various switches; and the like are mounted. In the present embodiment, the main circuit board 220 and the printed circuit board 260 are connected by a wide flexible flat cable 250 (hereinafter abbreviated as flat cable 250) which includes a flat plate conductor. The frame 240 corresponds to an example of the frame in the applied aspects described above. The flat cable 250 corresponds to an example of the cable in the basic aspects described above, and also to an example of the flat cable in the applied aspects described above. Note that a cable constructed using electrical wire members or a flexible printed circuit board may be used instead of the flat cable 250. However, because the wide flat cable 250 has the characteristic of being easily pulled out from the connector when twisted, it is possible to achieve a large effect by applying them to the present embodiment.

The flat cable 250 fitted to the printed circuit board 260 passes through a through hole 241 provided in the frame 240 and is fitted to a connector 221 provided on the main circuit board 220.

Figure 7:
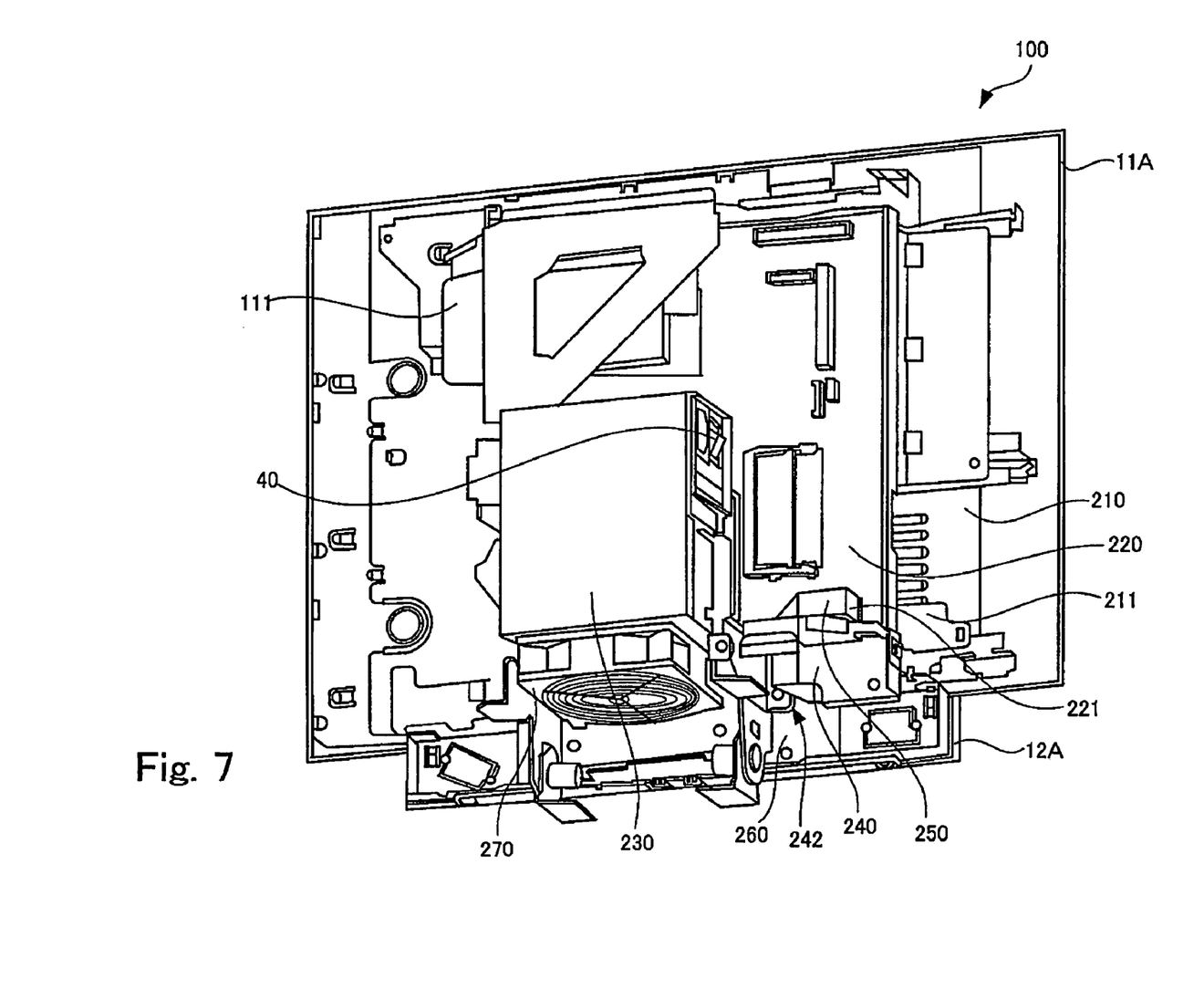
FIG. 7 is a rear view of the personal computer with the upper rear casing and a lower rear casing removed.

FIG. 7 is a rear view of the personal computer 100 after the upper rear casing 11B and the lower rear casing 12B have been removed.

As shown in FIG. 7, a cooling fan 270 is provided on a rear side of the lower front casing 12A. Not shown in FIG. 7, the CPU 101 shown in FIG. 5 is provided between the power supply device 230 and the cooling fan 270. Heat generated by the power supply device 230 and the CPU 101 is dissipated by external air taken in by the cooling fan 270. A lower section of the frame 240 contains the printed circuit board 260 which is arranged in the lower front casing 12A. The flat cable 250 fitted to the printed circuit board 260 passes to an upper section of the frame 240 through a recess 242 provided in the frame 240 and a through hole 241 shown in FIG. 6. The printed circuit board 260 corresponds to an example of the printed circuit board in the basic embodiment described above.

Figure 8:
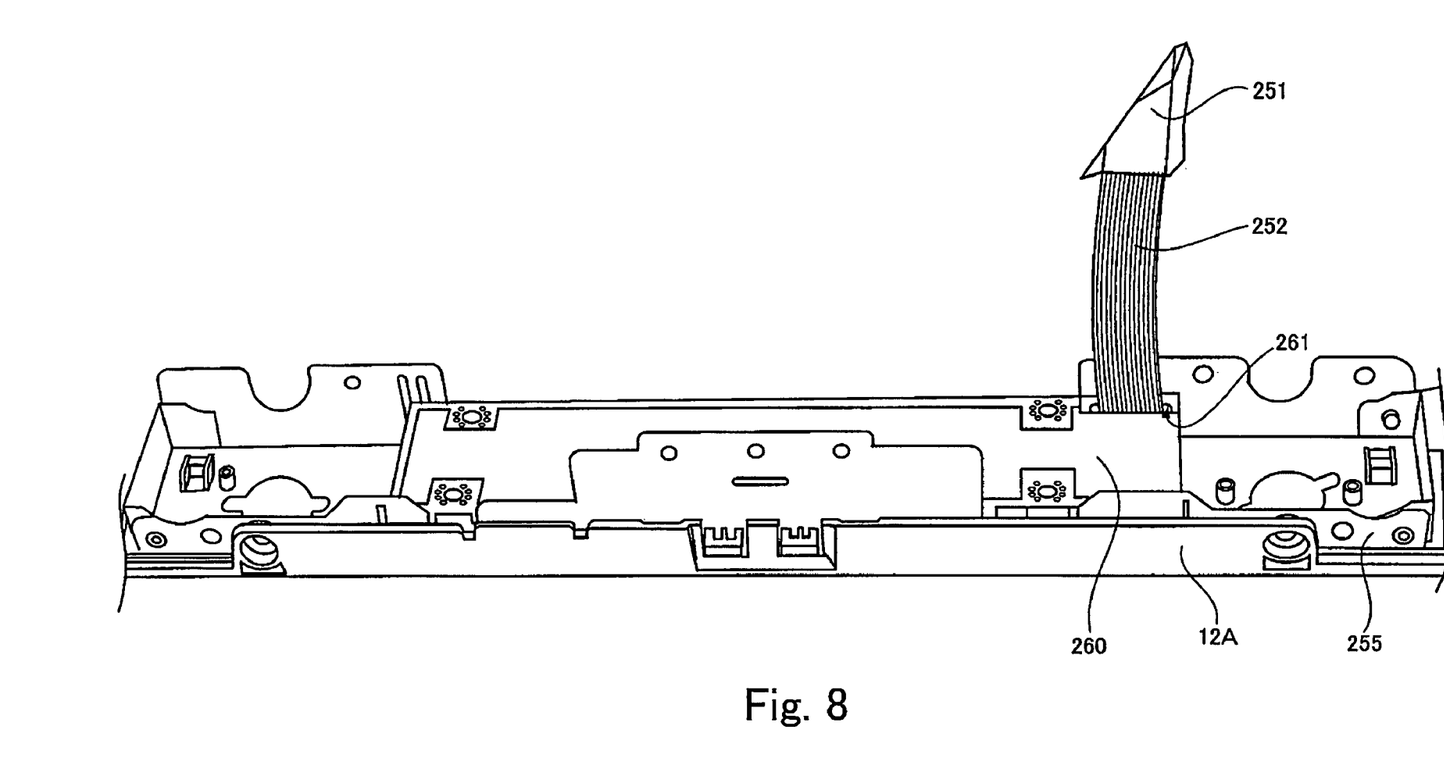
FIG. 8 is a diagram showing a printed circuit board mounted in the lower front casing.

FIG. 8 is a diagram showing the printed circuit board 260 installed in the lower front casing 12A.

The printed circuit board 260 is fixed with a surface thereof on which a connector 262 (see FIG. 9) for the flat cable 250 is provided facing towards the lower front casing 12A through the metal plate frame 255 to which the lower front casing 12A is attached. The flat cable 250 includes a first terminal 253 (see FIGS. 11A and 11B) which is fit to the connector 262 of the printed circuit board 260, a second terminal 251 which is fit to the connector 221 of the main circuit board 220 shown in FIG. 7, and a connecting wire portion 252 located between the first terminal 253 and the second terminal 251. The second terminal 251 corresponds to an example of the second terminal in the basic aspects described above. The first terminal 253 is fitted to a connector provided on the front surface side of the printed circuit board 260. In addition, the connecting wire portion 252 is extended through the through hole 261 from the rear surface side of the printed circuit board 260 to the upper section of the frame 240 shown in FIG. 7. In the upper section of the frame The second terminal 251 is fitted to the connector 221, shown, of the main circuit board 220 in FIG. 7.

Here, the printed circuit board 260 is installed with the connector facing towards the lower front casing 12A. Further, as shown in FIG. 7, a cooling fan 270 and the like are attached to a rear surface side of the printed circuit board 260. Thus, as the printed circuit board 260 is hidden, it is difficult to find a failure when the flat cable 250 is pulled out from the printed circuit board 260. Moreover, an operation to reconnect the flat cable is such troublesome.

Figure 9:
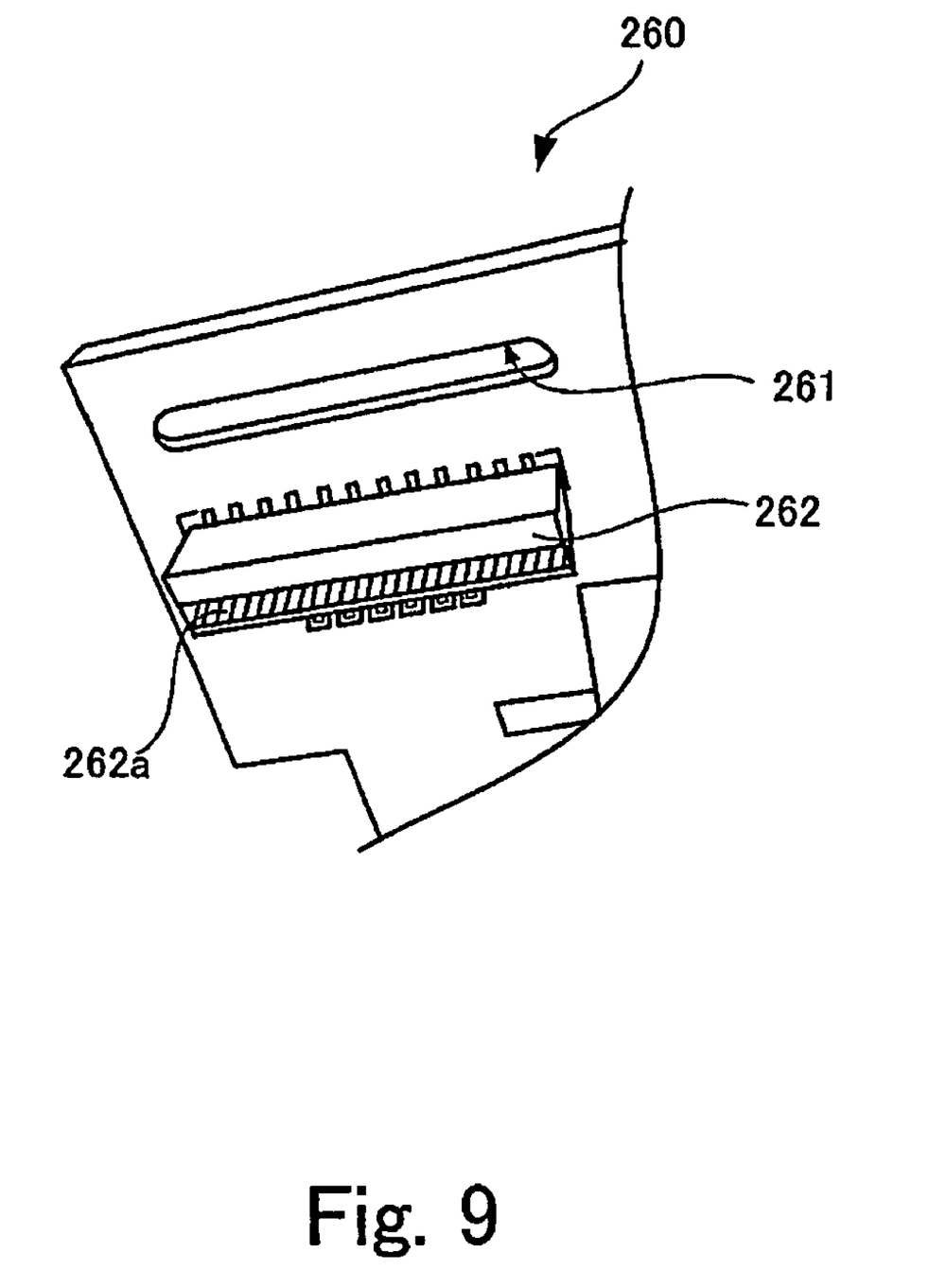
FIG. 9 is an enlarged view of a front surface side of the printed circuit board.

FIG. 9 is an enlarged view of the front surface side of the printed circuit board 260.

A connector 262 to which the terminal 251 of the flat cable 250 is fitted is provided on the front surface side of the printed circuit board 260. The through hole 261, which is also shown in FIG. 8, is provided in proximity to the connector 262. In the embodiment, the connector 262 has a long form in which plural terminals 262a are aligned in a direction. The through hole 261 have a long opening (a slit) in parallel with the connector 262 and is longer several millimeters than a length in the a longitudinal direction of the connector 262. The connector 262 corresponds to an example of the connector of the basic aspects. The multiple terminals 262a are corresponds to example of the multiple terminals of the applied aspects described above. The through hole 261 corresponds to an example of the "through hole penetrating the printed circuit board" of the basic aspects described above.

Figure 10:
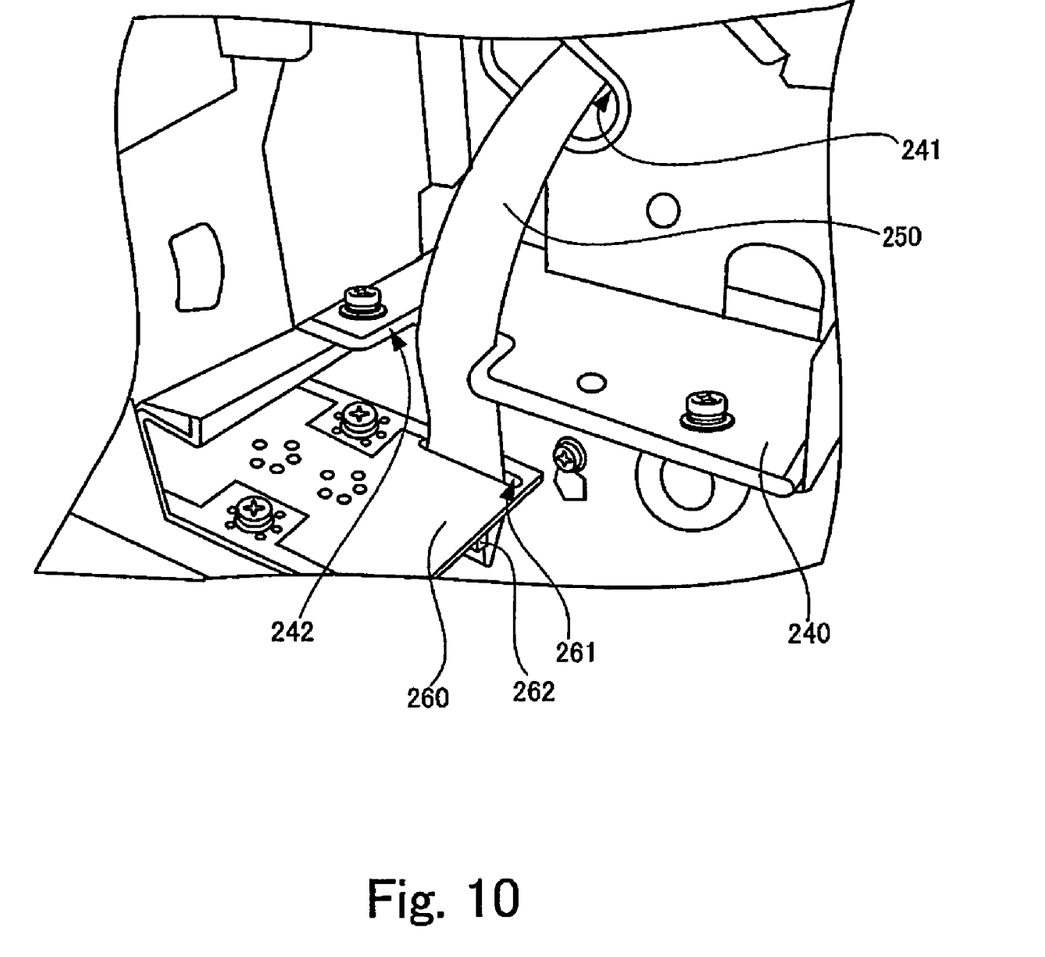
FIG. 10 is a diagram showing a flat cable attached to the printed circuit board.
Figure 11:
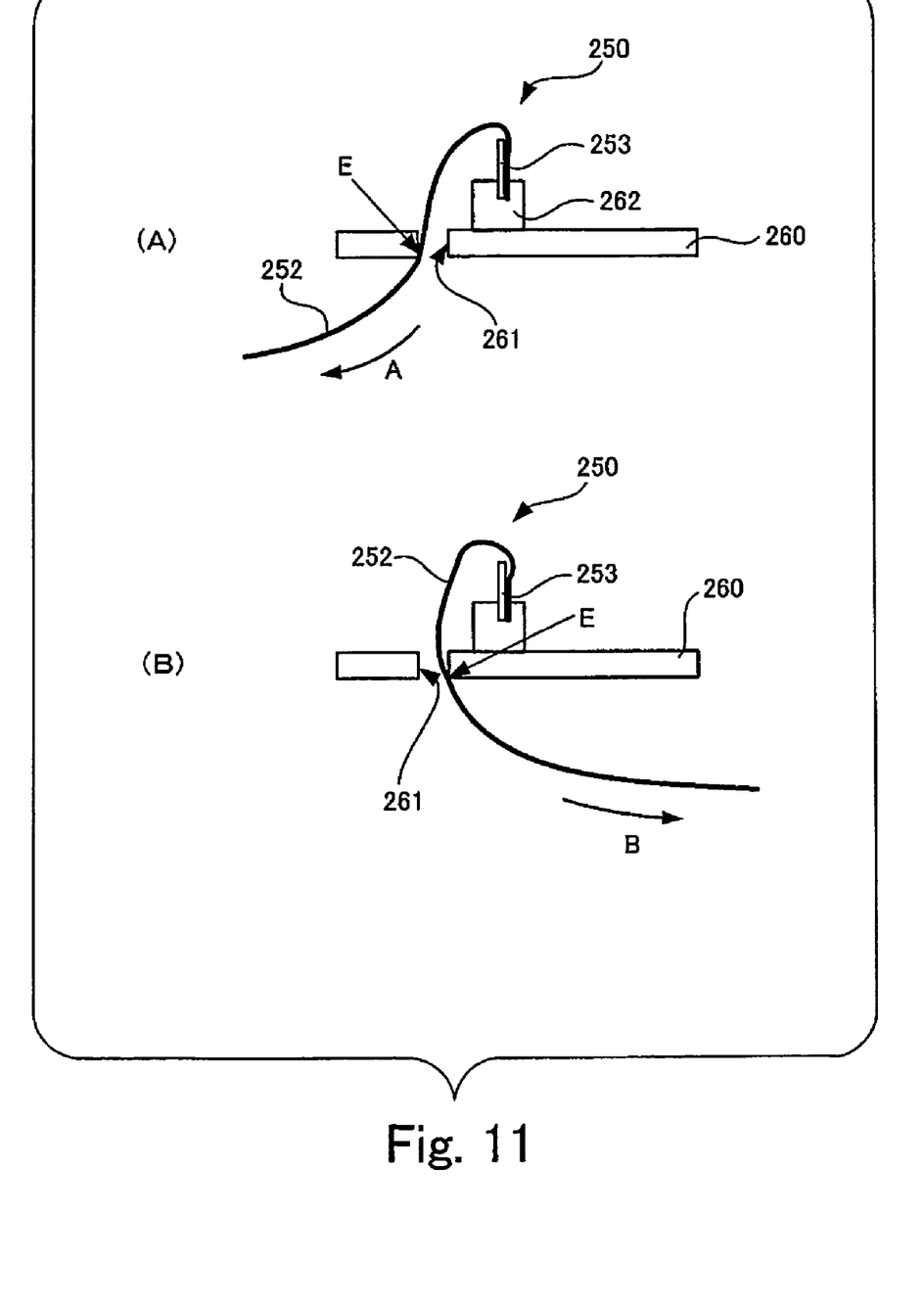
FIGS. 11A and 11B are a diagrams for describing a force applied to a connector and a terminal.

FIG. 10 is a diagram showing the flat cable 250 fitted to the printed circuit board 260. FIGS. 11A and 11B are diagrams for describing forces which may be applied to the connector 262 and the first terminal 253.

The first terminal 253 of the flat cable 250 is fitted to the connector 262 on the front surface side of the printed circuit board 260. The flat cable 250 is routed through the through hole 261 to the rear surface side of the printed circuit board 260. The first terminal 253 corresponds to an example of the first terminal in the basic aspects described above.

The flat cable 250 is passed through the through hole 261 to be extended to a rear surface of the printed circuit board 260 with respect to a front surface on which the connector 262 is provided. Hence, when the flat cable 250 is pulled, a force is applied in the downwards direction of FIGS. 11A and 11B to the first terminal 253 provided at an end of the flat cable 250 and the flat cable 250 is prevented from being pulled out from the connector 262. If the wide flat cable 250 is twisted in proximity to the first terminal 253 fitted to the connection 262, there is a risk that the connection 250 is pulled out from the connector 262 or damaged. In this embodiment, however, movement in the width direction of the flat cable 250 is restrained by the through hole 261. Hence, the risk that the first terminal 253 is pulled out when the flat cable 250 is moved in a transverse direction during maintenance or the like can be alleviated. In addition, as the through hole 261 being in parallel with the connector 262 and having a length not less than the width of the connector 262, so that the flat cable 250 fitted to the connector 262 is to pass through the through hole 261 in a straight state without twisting, thereby alleviating a damage to the flat cable 250.

FIGS. 11A and 11B show states in which the flat cable 250 is pulled in a direction perpendicular to a longitudinal direction of the through hole 261. As shown in FIGS. 11A and 11B, when the flat cable 250 is pulled in the direction indicated by the arrows A and B, the connecting wire portion 252 of the flat cable 250 makes contact with an edge E of the through hole 261. The edge E becomes a point of action, reducing the load on the first terminal 253 of the flat cable 250 and on the connector 262 of the printed circuit board 260. Thus, by the through hole 261, it is possible to suppress bending of the flat cable 250, and to prevent of the flat cable 250 from being pulled out and damage or the like to the first terminal 253 and the connector 262.

In addition, as shown in FIG. 10, the frame 240 is provided with the recess 242 having a width approximately equal to the width of the flat cable 250 and a slit-type through hole 241 which is longer than the width of the flat cable 250. The flat cable 250 is passed through to the rear surface side of the printed circuit board 260, further passes through the recess 242 and the through hole 241 and connects to the main circuit board 220 in the upper side. Corners of the recess 242 and the through hole 241 of the frame 240 are formed to be rounded and damage to the flat cable 250 caused by the metal flame 240 is alleviated to hold the flat cable.

As described above, according to the personal computer 100 of the present embodiment, movement of the flat cable 250 is restrained by the through holes and the recess provided in the printed circuit board 260 and the frame 240. Hence, there is no need to prepare a jumper lead or a special connector with a hook, and it is possible to prevent a flat cable from being pulled out and damage to the flat cable at a low cost.

Completing the description of the first embodiment of the electronic device, a second embodiment of the electronic device will be described. Since the second embodiment has the same construction as the first embodiment except for only that a recess is provided in the printed circuit board instead of the through hole, the same reference numerals are used for the same elements to omit redundant descriptions, difference from the first embodiment will be described.

Figure 12:
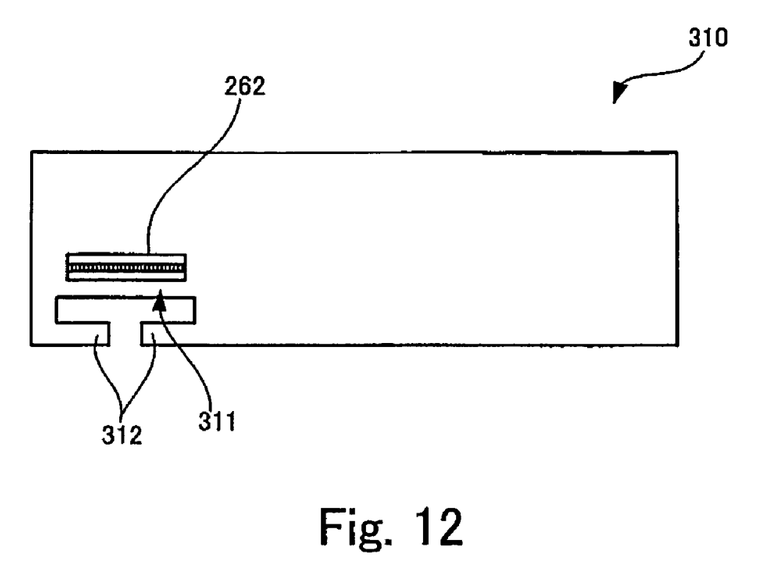
FIG. 12 is an enlarged view of a rear surface side of the printed circuit board used in a personal computer that is a second embodiment of the electronic device.

FIG. 12 is an enlarged view of a rear surface side of a printed circuit board 310 used in a personal computer which is the specific second embodiment of the electronic device.

The printed circuit board 310 of the present embodiment differs from the printed circuit board 260 of the first embodiment shown in FIG. 9 in that a recess 311 rather than the through hole 261 is provided in a periphery of the connector 262. The recess 311 corresponds to an example of the "recess formed in an edge section of the circuit board" in the basic aspects described above.

Similar to the through hole 261 shown in FIG. 9, the recess 311 is several millimeters longer than a longitudinal direction length of the connector 262 and is formed in parallel with the connector 262.

Since the recess 311 formed in this way in the printed circuit board 310 in place of the through hole also restrains movement of the cable, it is possible to prevent the cable from being damaged and being pulled out. Note, however, when the cable is pulled, an opening section 312 of the recess 311 formed in printed circuit board 310 may apply an undesirable load to the cable. For this reason, it is preferable to provide a through hole in the printed circuit board is preferable to the provision of a recess. Moreover, providing a through hole in the printed circuit board has further advantages over forming a recess in terms of the ease of manufacture and the strength of the resulting printed circuit board.

Completing the description of the second embodiment of the electronic device, a third embodiment of the electronic device will be described. The third embodiment differs from the second embodiment in the form of the recess formed in the printed circuit board.

Figure 13:
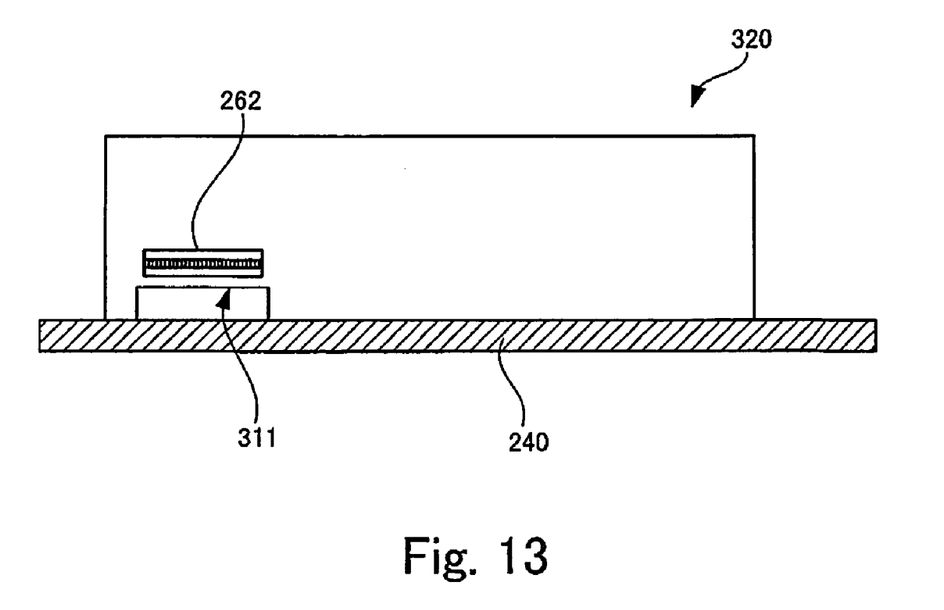
FIG. 13 is an enlarged view of a rear surface side of the printed circuit board used in a personal computer that is a third embodiment of the electronic device.

FIG. 13 is an enlarged view of a rear surface side of a printed circuit board 320 used in a personal computer which is the specific third embodiment of the electronic device.

The printed circuit board 320 of the present embodiment is proved with a cut-out section 311 different from the recess 311 provided in the printed circuit board 310 of the second embodiment shown in FIG. 12 The cut-out section 311 is corresponds to an example of the "recess formed in an edge section of the circuit board" in the basic aspects described above.

In the printed circuit board 320 shown in FIG. 13, an edge on the side where the cut-out section 311 is provided is in contact with the frame 240 and a through hole is formed by the printed circuit board 320 and the frame 240. By providing the cut-out section 311 in the printed circuit board 320 and having another member make contact with an edge of the printed circuit board 320 in this way, the opening section 312 of the recess 311 shown in FIG. 12 disappears, and it is possible to obtain advantages similar to those in the case in which a through hole is provided in the printed circuit board.

Here, a personal computer is exemplified as an example of the electronic device described in the "SUMMARY OF THE INVENTION", however, the electronic device may be a television or a mobilephone, or any other device in which a cable is fitted to a printed circuit board.

Further, in the above description, a flexible flat cable is used as an example of the cable described in the "SUMMARY OF THE INVENTION", however, the cable may be a cable constructed from electrical wire members or a flexible printed circuit board and the like.

What is claimed is:

1. An electronic device, comprising:
    a printed circuit board including a first surface, a second surface which is a rear surface to the first surface, a connector mounted on the first surface, and, one of a through hole and a recess, the through hole being formed between the first surface and the second surface, and penetrating the printed circuit board, the recess being formed in an edge section of the printed circuit board;
    a cable including a first terminal that is removably fitted to the connector and a connecting wire portion located between the first terminal and a second terminal, the connecting wire portion being passed through either one of the through hole and the recess and extending from the first surface to the second surface of the printed circuit board in a state in which the first terminal is fitted to the connector; and
    a casing which houses the printed circuit board and the cable, wherein
    the cable is a flat cable in which a plurality of conductors are disposed in a direction perpendicular to a longitudinal direction of the conductors such that the connecting wire portion having a predetermined width is formed, and
    the one of the through hole and the recess of the printed circuit board is one of a long hole and a recess which have a straight line portion which is at least as long as the width of the connecting wire portion of the flat cable.

2. The electronic device according to claim 1, wherein
    the casing includes in the inside thereof a frame having a first surface, a second surface which is a rear surface to the first surface, and one of a through hole and a recess, the through hole being formed between the first surface and the second surface and penetrating the frame, the recess being formed in an edge section of the frame, and
    the connecting wire portion of the cable is passed through one of the through hole and the recess of the printed circuit board and being passed through one of the through hole and the recess of the frame.

3. The electronic device according to claim 1, wherein
    the connector includes a plurality of terminals which are disposed in a longitudinal direction of the connector and to which the plurality of conductors are electrically connected when the flat cable is installed, and
    the straight line portion of the one of the through hole and the recess is parallel to the longitudinal direction of the connector, and including a portion which is equal to or longer in length than a width, viewed in a direction perpendicular to the longitudinal direction, the width being formed by the plurality of terminals of the connector.

4. The electronic device according to claim 1, wherein
    the casing includes a front casing and a rear casing which is assembled with the front casing, and
    the casing houses the printed circuit board such that the first surface of the printed circuit board is on a side of the front casing, and houses other components to be mounted between the second surface of the printed circuit board and the rear casing in a state in which the printed circuit board is hidden.

5. The electronic device according claim 1, wherein the flat cable is a flexible flat cable in which the conductor is a flat plate conductor.

6. The electronic device according to claim 1, wherein the flat cable is a flexible printed circuit board.

7. A printed circuit board unit, comprising:
    a printed circuit board including a first surface, a second surface which is a rear surface to the first surface, a connector mounted on the first surface, and, one of a through hole and a recess, the through hole being formed between the first surface and the second surface, and penetrating the printed circuit board, the recess being formed in an edge section of the printed circuit board;
    a cable including a first terminal that is removably fitted to the connector and a connecting wire portion located between the first terminal and a second terminal, the connecting wire portion being passed through either one of the through hole and the recess and extending from the first surface to the second surface of the printed circuit board in a state in which the first terminal is fitted to the connector, wherein
    the cable is a flat cable in which a plurality of conductors are disposed in a direction perpendicular to a longitudinal direction of the conductors such that the connecting wire portion having a predetermined width is formed, and
    the one of the through hole and the recess of the printed circuit board is one of a long hole and a recess which have a straight line portion which is at least as long as the width of the connecting wire portion of the flat cable.

8. The printed circuit board unit according to claim 7, wherein
    the connector includes a plurality of terminals which are disposed in a longitudinal direction of the connector and to which the plurality of conductors are electrically connected when the flat cable is installed, and
    the straight line portion of the one of the through hole and the recess is parallel to the longitudinal direction of the connector, and including a portion which is equal to or longer in length than a width, viewed in a direction perpendicular to the longitudinal direction, the width being formed by the plurality of terminals of the connector.

9. The printed circuit board unit according to claim 7, wherein the flat cable is a flexible flat cable in which the conductor is a flat plate conductor.

10. The printed circuit board unit according to claim 7, wherein the flat cable is a flexible printed circuit board.

* * * * *